(12) United States Patent
Liang et al.

(10) Patent No.: US 10,157,916 B2
(45) Date of Patent: Dec. 18, 2018

(54) SEMICONDUCTOR DEVICE AND MANUFACTURING METHOD THEREOF

(71) Applicant: Taiwan Semiconductor Manufacturing Co., Ltd., Hsinchu (TW)

(72) Inventors: Victor Chiang Liang, Hsinchu (TW); Chi-Feng Huang, Hsinchu County (TW); Chia-Chung Chen, Keelung (TW); Chun-Pei Wu, Nantou County (TW); Fu-Huan Tsai, Kaohsiung (TW); Chung-Hao Chu Chu, Hsinchu (TW); Chin-Nan Chang, Tainan (TW); Ching-Yu Yang, Taichung (TW); Ankush Chaudhary, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 15/482,829

(22) Filed: Apr. 10, 2017

(65) Prior Publication Data

US 2018/0294261 A1 Oct. 11, 2018

(51) Int. Cl.
| | |
|---|---|
| *H01L 21/02* | (2006.01) |
| *H01L 27/088* | (2006.01) |
| *H01L 21/265* | (2006.01) |
| *H01L 21/8234* | (2006.01) |
| *H01L 21/266* | (2006.01) |
| *H01L 29/08* | (2006.01) |
| *H01L 29/78* | (2006.01) |
| *H01L 29/10* | (2006.01) |

(52) U.S. Cl.
CPC ........ *H01L 27/088* (2013.01); *H01L 21/0223* (2013.01); *H01L 21/266* (2013.01); *H01L 21/26513* (2013.01); *H01L 21/823418* (2013.01); *H01L 21/823462* (2013.01); *H01L 29/0847* (2013.01); *H01L 29/1095* (2013.01); *H01L 29/7833* (2013.01)

(58) Field of Classification Search
USPC ..... 257/408, 900, 902–903, E21.19–E21.21, 257/E2.394–E21.458, E21.615–E21.694; 438/135, 142
See application file for complete search history.

(56) References Cited

U.S. PATENT DOCUMENTS

2008/0286920 A1* 11/2008 Kim ................ H01L 21/823807 438/218
2010/0013017 A1* 1/2010 Tsutsui ............ H01L 21/823462 257/368

* cited by examiner

*Primary Examiner* — Tram H Nguyen
(74) *Attorney, Agent, or Firm* — JCIPRNET

(57) ABSTRACT

Provided is a semiconductor device includes a gate stack, a first doped region, a second doped region, a first lightly doped region and a second lightly doped region. The gate stack is disposed on a substrate. The first doped region is located in the substrate at a first side of the gate stack. The second doped region is located in the substrate at a second side of the gate stack. The first lightly doped region is located in the substrate between the gate stack and the first doped region. The second lightly doped region is located in the substrate between the gate stack and the second doped region. A property of the first lightly doped region is different from a property of the second lightly doped region.

16 Claims, 13 Drawing Sheets

SEMICONDUCTOR DEVICE AND MANUFACTURING METHOD THEREOF

BACKGROUND

The semiconductor integrated circuit (IC) industry has experienced rapid growth. Over the course of this growth, functional density of the devices has generally increased with the device feature size.

In order to meet the requirements for smaller sizes and higher packing densities, the IC includes a semiconductor device with different properties.

DETAILED DESCRIPTION

Figure 1A:
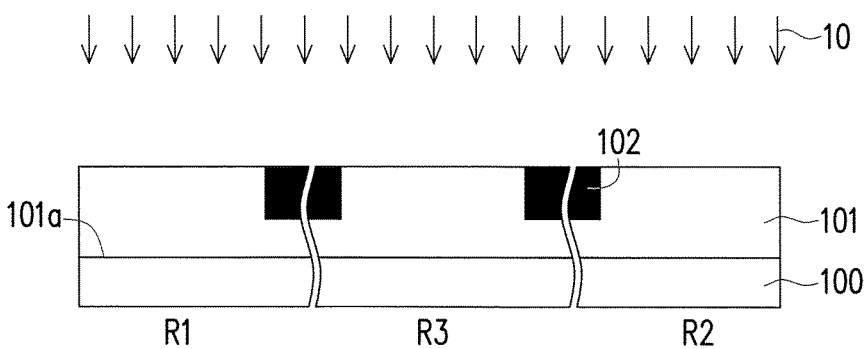
FIG. 1A through FIG. 1B are schematic cross-sectional views illustrating a manufacturing process of a semiconductor device according to a first embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
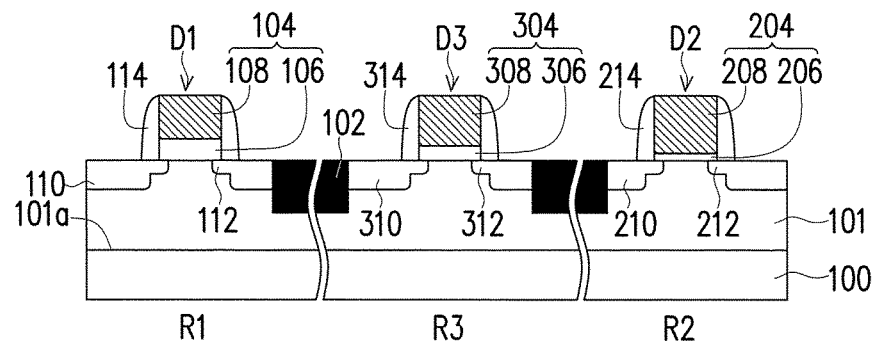
Figure 2:
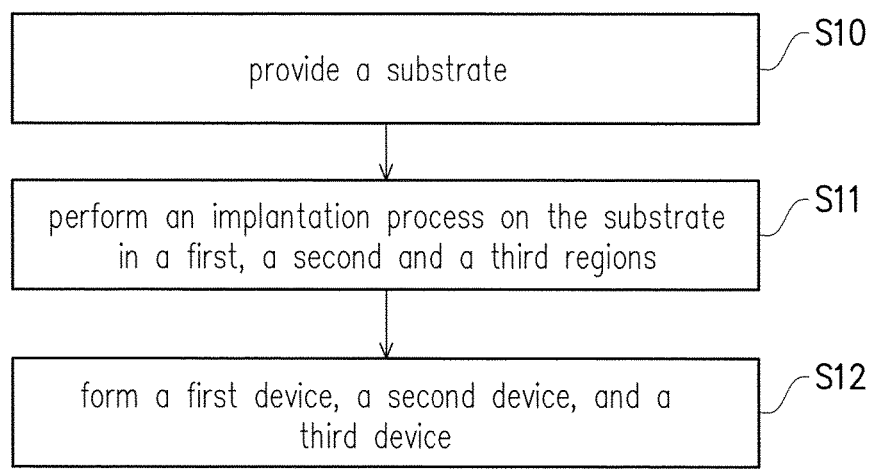
FIG. 2 is a flowchart illustrating a manufacturing method of the semiconductor device according to the first embodiment of the disclosure.

FIG. 1A through FIG. 1B are schematic cross-sectional views illustrating a manufacturing process of a semiconductor device according to a first embodiment of the disclosure. FIG. 2 is a flowchart illustrating a manufacturing method of the semiconductor device according to the first embodiment of the disclosure.

Referring to FIG. 1A and FIG. 2, in step S10, a substrate 100 is provided. The substrate 100 includes a bulk substrate, a silicon-on-insulator (SOI) substrate or a germanium-on-insulator (GOI) substrate, for example. In one embodiment, the substrate 100 includes a crystalline silicon substrate (e.g., wafer). The substrate 100 may include various doped regions depending on design requirements (e.g., p-type substrate or n-type substrate). In some embodiments, a doped region 101, formed in the substrate 100, may be a well, a buried doped region, or a combination thereof. In some embodiments, the doped region 101 and the substrate 100 have the same conductivity type. In some alternative embodiments, the doped region 101 and the substrate 100 have different conductivity types. In some embodiments, the doped region 101 may be doped with p-type or n-type dopants. For example, the doped region 101 may be doped with p-type dopants, such as boron, $BF_2^+$, and/or a combination thereof, n-type dopants, such as phosphorus, arsenic, and/or a combination thereof. In some alternative embodiments, the substrate 100 may be made of some other suitable elemental semiconductors, such as diamond or germanium, a suitable compound semiconductor, such as gallium arsenide, silicon carbide, indium arsenide, or indium phosphide, or a suitable alloy semiconductor, such as silicon germanium carbide, gallium arsenic phosphide, or gallium indium phosphide.

Referring to FIG. 1A and FIG. 2, in step S10, isolation structures 102 are formed in the substrate 100. In some embodiments, the isolation structures 102 may be shallow trench isolation (STI) structures. The isolation structures 102 include silicon oxide, silicon nitride, silicon oxynitride, a spin-on dielectric material, a low-k dielectric material, or a combination thereof and formed by performing a high-density-plasma chemical vapor deposition (HDP-CVD) process, a sub-atmospheric CVD (SACVD) process, or a spin-on process, for example.

The substrate 100 may include a first region R1, a second region R2, and a third R3. In some embodiments, the first region R1 and the third region R3 may be periphery regions, for example, I/O regions, and the second region R2 may be a core region.

Referring to FIG. 1A and FIG. 2, in step S11 an implantation process 10 is performed on the substrate 100. The implantation process 10 may be a blanket ion implantation process, so that an implantation species is implanted into the doped region 101, the sidewalls and bottom of the isolation structures 102, a junction interface 101a between the doped region 101 and the substrate 100 in the first region R1, the second region R2 and the third region R3, or a combination thereof. As a result, defects and trap residues in the substrate 100 may be reduced. The implantation species may include fluorine (F). The implantation process 10 may be performed at a range of energy values and dosages. In some embodiments, the energy values may range from 30 keV to 80 keV, and the dosage may range from $1\times10^{13}/cm^2$ to $1\times10^{15}/cm^2$.

Referring to FIG. 1B and FIG. 2, in step S12, a first device D1, a second device D2, and a third device D3 are formed on the substrate 100 in the first region R1, the second region R2, and the third region R3 respectively. The first device D1, the second device D2, and the third device D3 may be the same or different. In some embodiments, the first device D1, the second device D2, and the third device D3 are a first metal-oxide semiconductor (MOS) device, a second MOS device, and a third MOS device respectively. The first MOS device includes a first gate stack 104 and first doped regions 110. Similarly, the second MOS device includes a second gate stack 204 and second doped regions 210; and the third MOS device includes a third gate stack 304 and third doped regions 310.

In some embodiments, the first gate stack 104 includes a first gate dielectric layer 106 and a first gate electrode 108. Similarly, the second gate stack 204 includes a second gate dielectric layer 206 and a second gate electrode 208. The third gate stack 304 includes a third gate dielectric layer 306 and a third gate electrode 308. In some embodiments, the first, second, and third gate dielectric layers 106, 206, and 306 include silicon oxide, silicon nitride, silicon oxynitride, high-k dielectric materials, or a combination thereof. The high-k dielectric materials are generally dielectric materials with a dielectric constant higher than 4. The high-k dielectric materials include metal oxide. In some embodiments, examples of the metal oxide used as the high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or a combination thereof. The gate dielectric layers 106, 206, and 306 are formed by performing a thermal oxidation process, a CVD process, an ALD process, or a combination thereof respectively. In some embodiments, the first, second, and third gate dielectric layers 106, 206, and 306 have different thicknesses. For example, the first gate dielectric layer 106 is thicker than the third gate dielectric layer 306, and the third gate dielectric layer 306 is thicker than the second gate dielectric layer 206.

The first, second, and third gate electrodes 108, 208, and 308 are formed on the first, second, and third gate dielectric layers 106, 206, and 306 respectively. In some embodiments, the first, second, and third gate electrodes 108, 208, and 308 are polysilicon gate stacks or replacement metal gate stacks. A material of the first, second, and third gate electrodes 108, 208, and 308 include a doped polysilicon, an undoped polysilicon, or a metal-containing conductive material. The metal-containing conductive material includes a work function layer, a seed layer, an adhesion layer, a barrier layer, or a combination thereof. The metal-containing conductive material includes Al, Cu, W, Ti, Ta, Ag, Ru, Mn, Zr, TiAl, TiN, TaN, WN, TiAlN, TaN, TaC, TaCN, TaSiN, NiSi, CoSi, or a combination thereof, for example. In some embodiments, the gate electrodes 108, 208, and 308 include metal-containing conductive materials suitable for a PMOS device, such as TiN, WN, TaN, or Ru. In some alternative embodiments, the first, second, and third gate electrodes 108, 208, and 308 include metal-containing conductive materials suitable for an NMOS device, such as Ti, Ag, Al, TiAl, TiAlN, TaC, TaCN, TaSiN, Mn, or Zr. The first, second, and third gate electrodes 108, 208, and 308 may be formed by performing a suitable process such as an ALD process, a CVD process, a PVD process, a plating process, or a combination thereof.

The first, second, and third doped regions 110, 210, and 310 are formed in the substrate 100 beside the first, second, and third gate stacks 104, 204 and 304 respectively. The first, second, and third doped regions 110, 210, and 310 may be source and drain regions respectively. In some embodiments, the first, second, and third doped regions 110, 210, and 310 have the same conductivity type dopants or different conductivity type dopants. In some embodiments, the first, second, and third devices D1, D2, and D3 are PMOS devices, and the first, second, and third doped regions 110, 210, and 310 have p-type dopants, such as boron, $BF_2^+$, and/or a combination thereof. In some alternative embodiments, the first, second, and third devices D1, D2, and D3 are NMOS devices, and the first, second, and third doped regions 110, 210, and 310 have n-type dopants, such as phosphorus, arsenic, and/or a combination thereof. In some alternative embodiments, the first, second, and third doped regions 110, 210, and 310 have different conductivity type dopants.

In some embodiments, the first, second, and third devices D1, D2, and D3 further include first, second, and third lightly doped source and drain (LDD) regions 112, 212, and 312 respectively. The first LDD regions 112 and the first doped regions 110 have the same conductivity type. Similarly, the second LDD regions 212 and the second doped regions 210 have the same conductivity type. The third LDD regions 312 and the third doped regions 310 have the same conductivity type.

Via the blanket ion implantation of fluorine into the substrate, the device noise can be significantly reduced.

FIG. 3A through FIG. 3E are schematic cross-sectional views illustrating a manufacturing process of a semiconductor device according to a second embodiment of the disclosure. FIG. 4 is a flowchart illustrating a manufacturing method of the semiconductor device according to the second embodiment of the disclosure.

Figure 3A:
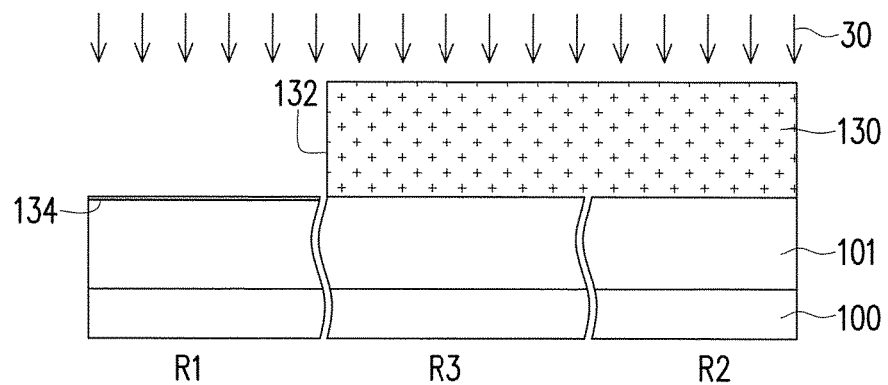
FIG. 3A through FIG. 3E are schematic cross-sectional views illustrating a manufacturing process of a semiconductor device according to a second embodiment of the disclosure.
Figure 3B:
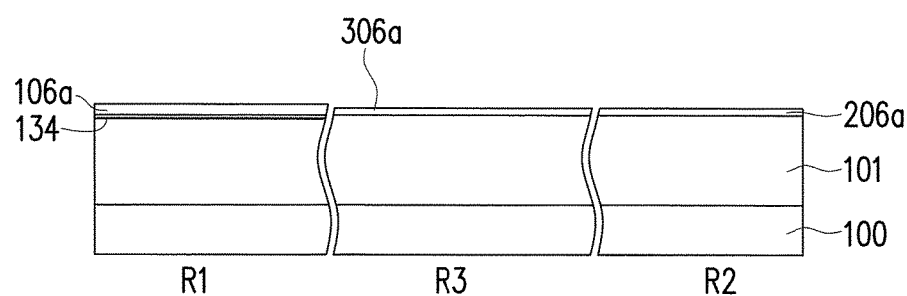
Figure 3C:
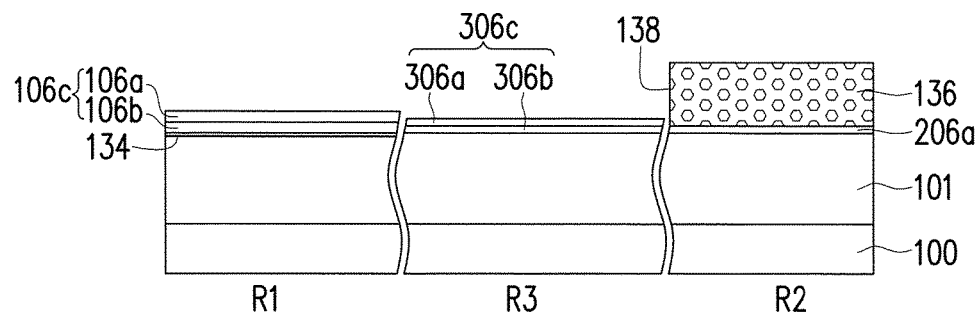
Figure 4:
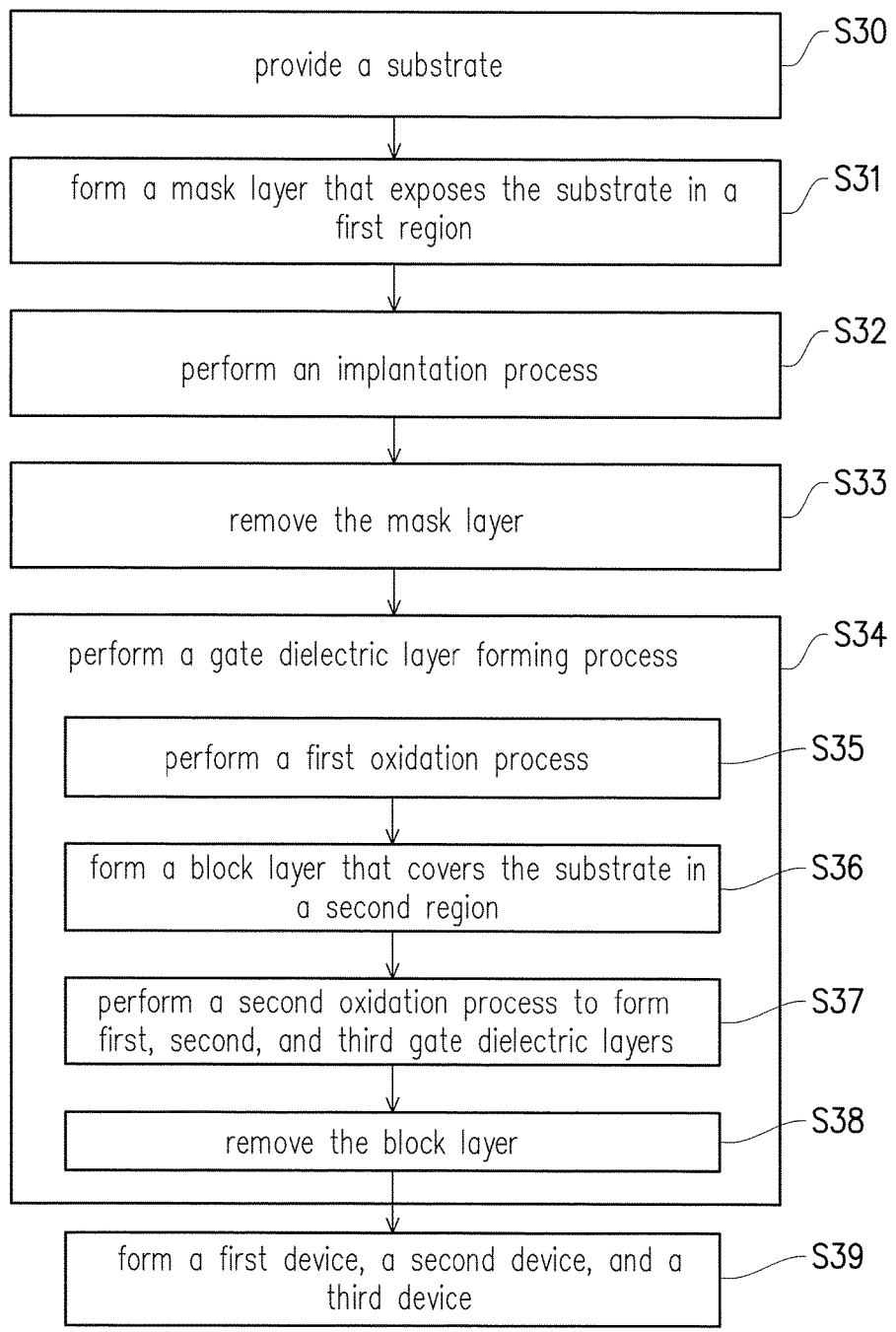
FIG. 4 is a flowchart illustrating a manufacturing method of the semiconductor device according to the second embodiment of the disclosure.

Referring to FIG. 3A, FIG. 3C, and FIG. 4, in step S30, a substrate 100 is provided. The substrate 100 may include a doped region 101 and isolation structures (not shown) formed therein. The substrate 100 may include a first region R1, a second region R2, and a third R3. In some embodiments, a first dielectric layer 106c, a second dielectric layer 206a, and a third dielectric layer 306c are to be formed on the substrate 100 in the first region R1, the second region R2, and the third region R3 respectively. The first dielectric layer 106c is thicker than the third dielectric layer 306c, and the third dielectric layer 306c is thicker than the second dielectric layer 206a.

In some alternative embodiments, the first region R1 and the third region R3 may be periphery regions, for example, I/O regions, and the second region R2 may be a core region. For, example, a first device D1, a second device D2, and a third device D3 (shown in FIG. 3E) are to be formed in the first region R1, the second region R2, and the third region R3 respectively. The first device D1, the second device D2, and the third device D3 may be a first MOS device, a second MOS device, and a third MOS device respectively. Further, a threshold voltage of the first MOS device in the first region R1 is greater than a threshold voltage of the third MOS device in the third region R3.

Referring to FIG. 3A and FIG. 4, in step S31, a mask layer 130 having an opening 132 is formed on the substrate 100. The mask layer 130 covers the second region R2 and the third region R3, and the opening 132 of the mask layer 130 exposes the first region R1. In some embodiments, the mask layer 130 is a patterned photoresist layer.

Referring to FIG. 3A and FIG. 4, in step S32, an implantation process 30 is performed on a surface of the substrate 100 by using the mask layer 130 as a mask. The implantation process 30 may be an ion implantation process, so that an implantation species is implanted into the doped region 101 in the first region R1. As a result, a growth promoting region 134 is formed in the doped region 101 in the first region R1. The implantation species may include growth promoting species, such as fluorine (F). The implantation process 30 may be performed at a range of energy values and dosages. In some embodiments, the energy values may range from 5 keV to 15 keV, and the dosage may range from $1\times10^{14}/cm^2$ to $1\times10^{16}/cm^2$.

Referring to FIG. 3B and FIG. 4, in step S33, the mask layer 130 is removed to expose surfaces of the doped region 101 in the first region R1, the second region R2, and the third region R3. The mask layer 130 may be removed by an ashing process, a wet clean process, or a combination thereof.

Referring to FIG. 3B, FIG. 3C, and FIG. 4, in step S34, a gate dielectric layer forming process is performed on so as to form the first dielectric layer 106c, the second dielectric layer 206a, and the third dielectric layer 306c on the doped region 101 in the first region R1, the second region R2, and the third region R3 respectively. In some embodiments, the gate dielectric layer forming process may include the fallowing processes.

Referring to FIG. 3B and FIG. 4, in step S35, a first oxidation process is performed, so as to form a first dielectric layer 106a, a second dielectric layer 206a, and a third dielectric layer 306a on the doped region 101 in the first region R1, the second region R2, and the third region R3. Because the growth promoting region 134 is formed in the first region R1 and not formed in the second region R2 and the third region R3, the first dielectric layer 106a is thicker than the second dielectric layer 206a and the third dielectric layer 306a, and the second dielectric layer 206a and the third dielectric layer 306a have similar thicknesses. In some embodiments, the first oxidation process is a thermal oxidation process, a high temperature oxidation process, or a combination thereof. The first oxidation process may be performed at a temperature range from 800° C. to 1200° C.

Referring to FIG. 3C and FIG. 4, in step S36, a block layer 136 having an opening 138 is formed on the substrate 100. The block layer 136 covers the second region R2, and the opening 138 of the block layer 136 exposes the first region R1 and the third region R3. The block layer 136 may be a single layer or multiple layers. In some embodiments, the block layer 136 is formed of a dielectric material layer. The dielectric material layer may be silicon nitride formed by performing a suitable process such as an ALD process, a CVD process, a PVD process, a plating process, or a combination thereof, for example. Thereafter, the dielectric material layer is patterned by performing a photolithographic process and an etching process.

Referring to FIG. 3C and FIG. 4, in step S37, a second oxidation process is performed by using the block layer 136 as a mask, so as to form a first dielectric layer 106b and a third dielectric layer 306b on the doped region 101 in the first region R1 and the third region R3 respectively. The second region R2 is covered by the block layer 136, therefore the thickness of the second dielectric layer 206a is not increased significantly.

As a result, the first dielectric layer 106c, the second dielectric layer 206a, and the third dielectric layer 306c are formed on the doped region 101 in the first region R1, the second region R2, and the third region R3 respectively. The first dielectric layer 106c includes the first dielectric layer (first part) 106a and the first dielectric layer (second part) 106b, and the third dielectric layer 306c includes the third dielectric layer (first part) 306a and the third dielectric layer (second part) 306b.

The first dielectric layer 106c is thicker than the third dielectric layer 306c, and the third dielectric layer 306c is thicker than the second dielectric layer 206a. In some embodiments, the thickness of the first dielectric layer 106c is about 55 angstroms to about 60 angstroms, the thickness of the third dielectric layer 306c is about 41 angstroms to about 51 angstroms, and the thickness of the second dielectric layer 206a is about 15 angstroms to about 25 angstroms.

Figure 3D:
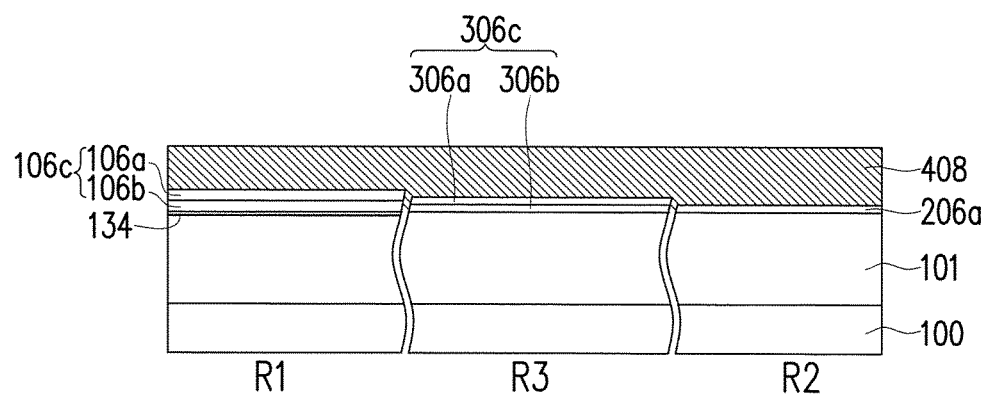
Figure 3E:
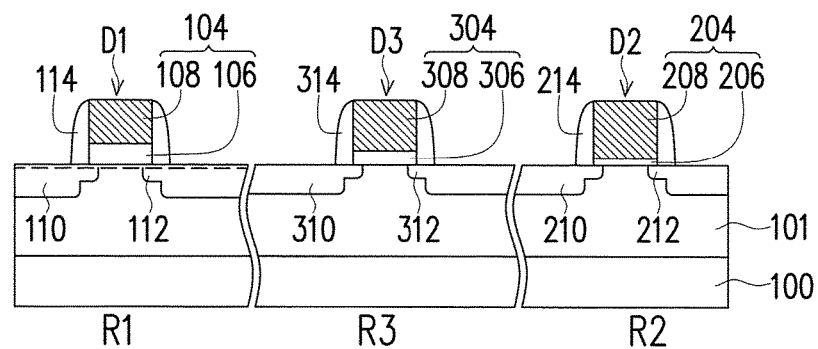

Referring to FIG. 3C, FIG. 3E, and FIG. 4, in step S38 and S39, the block layer 136 is removed by an etch process such as an isotropic etch process. A first device D1, a second device D2, and a third device D3 are formed on the substrate 100 in the first region R1, the second region R2, and the third region R3 respectively. The first device D1, the second device D2, and the third device D3 include a first gate dielectric layer 106, a second gate dielectric layer 206, and a third gate dielectric layer 306. The first, second, and third gate dielectric layers 106, 206, and 306 are formed from the first dielectric layer 106c, the second dielectric layer 206a, and the third dielectric layer 306c.

In some embodiments, the first device D1, the second device D2, and the third device D3 are a first metal-oxide semiconductor (MOS) device, a second MOS device, and a third MOS device respectively. The first MOS device includes a first gate stack 104 and first doped regions 110. Similarly, the second MOS device includes a second gate stack 204 and second doped regions 210; and the third MOS device includes a third gate stacks 304 and third doped regions 310. In some embodiments, the first, second, and third devices D1, D2, and D3 further include first, second, and third lightly doped source and drain (LDD) regions 112, 212, and 312 respectively.

In some embodiments, the first gate stack 104 includes the first gate dielectric layer 106 and a first gate electrode 108. Similarly, the second gate stack 204 includes the second gate dielectric layer 206 and a second gate electrode 208. The third gate stack 304 includes the third gate dielectric layer 306 and a third gate electrode 308.

In the embodiments, in which the first device D1, the second device D2, and the third device D3 are the first MOS device, the second MOS device, and the third MOS device respectively, the first device D1, the second device D2, and the third device D3 may be formed by the following processes.

Referring to FIG. 3D and FIG. 3E, a gate material layer 408 is formed on the first dielectric layer 106c, the second dielectric layer 206a, and the third dielectric layer 306c. A material of the gate material layer 408 includes a doped polysilicon, an undoped polysilicon, or a metal-containing conductive material. The metal-containing conductive material includes a work function layer, a seed layer, an adhesion layer, a barrier layer, or a combination thereof. The metal-containing conductive material includes Al, Cu, W, Ti, Ta, Ag, Ru, Mn Zr, TiAl, TiN, TaN, WN, TiAlN, TaN, TaC, TaCN, TaSiN, NiSi, CoSi, or a combination thereof, for example. In some embodiments, the gate electrodes 108, 208, and 308 include metal-containing conductive materials suitable for a PMOS device, such as TiN, WN, TaN, or Ru.

In some alternative embodiments, the first, second, and third gate electrodes 108, 208, and 308 include metal-containing conductive materials suitable for an NMOS device, such as Ti, Ag, Al, TiAl, TiAlN, TaC, TaCN, TaSiN, Mn, or Zr. The first, second, and third gate electrodes 108, 208, and 308 may be formed by performing a suitable process such as an ALD process, a CVD process, a PVD process, a plating process, or a combination thereof.

Referring to FIGS. 3D and 3E, the gate material layer 408, the first dielectric layer 106c, the second dielectric layer 206a, and the third dielectric layer 306c are patterned by performing a photolithographic process and an etching process, for example, so as to form the first gate stack 104 in the first region R1, the second gate stack 204 in the second region R2, and the third gate stack in the third region R3.

The first, second, and third LDD regions 112, 212, and 312 are formed in the doped region 101 beside the first gate stack 104, the second gate stack 204, and the third gate stack 304 respectively. The first, second, and third LDD regions 112, 212, and 312 may be formed by performing an ion implantation process respectively. In some embodiments, the first, second, and third devices D1, D2, and D3 are PMOS devices, the first, second, and third LDD regions 112, 212, and 312 have p-type dopants, such as boron, $BF_2^+$, and/or a combination thereof. In some alternative embodiments, the first, second, and third devices D1, D2, and D3 are NMOS devices, the first, second, and third LDD regions 112, 212, and 312 have n-type dopants, such as phosphorus, arsenic, and/or a combination thereof.

Referring to FIG. 3E, spacers 114, 214, and 314 are formed on the first gate stack 104, the second gate stack 204, and the third gate stack 304 respectively. The spacers 114, 214, and 314 may be formed by forming a spacer material layer on the substrate 100, and then the spacer material layer is etched by an anisotropic etch process.

Thereafter, the first, second, and third doped regions 110, 210, and 310 are formed in the substrate 100 beside the spacers 114, 214 and 314 respectively. The first, second, and third doped regions 110, 210, and 310 may be source and drain regions respectively. The first doped regions 110 and the first LDD regions 112 have the same conductivity type. Similarly, the second doped regions 210 and the second LDD regions 212 have the same conductivity type. The third doped regions 310 and the third LDD regions 312 have the same conductivity type. The first, second, and third doped regions 110, 210, and 310 may be formed by performing an ion implantation process respectively. As a result, the first device D1, the second device D2, and the third device D3 are formed.

Via the selective implantation of fluorine into the substrate in the first region, the first gate dielectric layer in the first region is thicker than the third gate dielectric layer in the third region. As a result, a device having high gain can be obtained.

FIG. 5A through FIG. 5F are schematic cross-sectional views illustrating a manufacturing process of a semiconductor device according to a third embodiment of the disclosure. FIG. 6 is a flowchart illustrating a manufacturing method of the semiconductor device according to the third embodiment of the disclosure.

The manufacturing process of the semiconductor device according to the third embodiment of the disclosure is similar to the manufacturing process of the semiconductor device according to the second embodiment of the disclosure. The difference is in the forming method of the first dielectric layer, the second dielectric layer, and the third dielectric layer formed in the first region R1, the second region R2, and the third region R3 respectively.

Figure 5A:
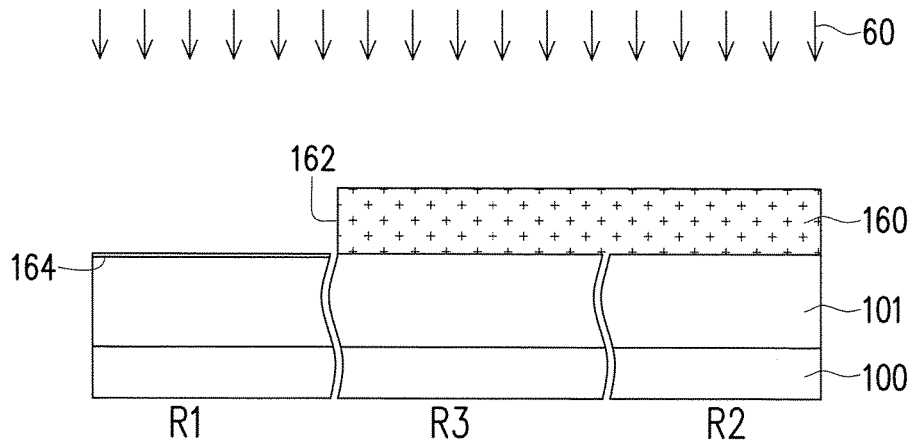
FIG. 5A through FIG. 5F are schematic cross-sectional views illustrating a manufacturing process of a semiconductor device according to a third embodiment of the disclosure.
Figure 5F:
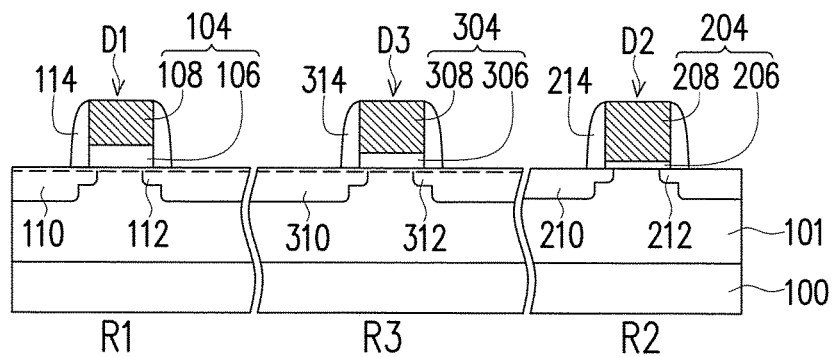
Figure 6:
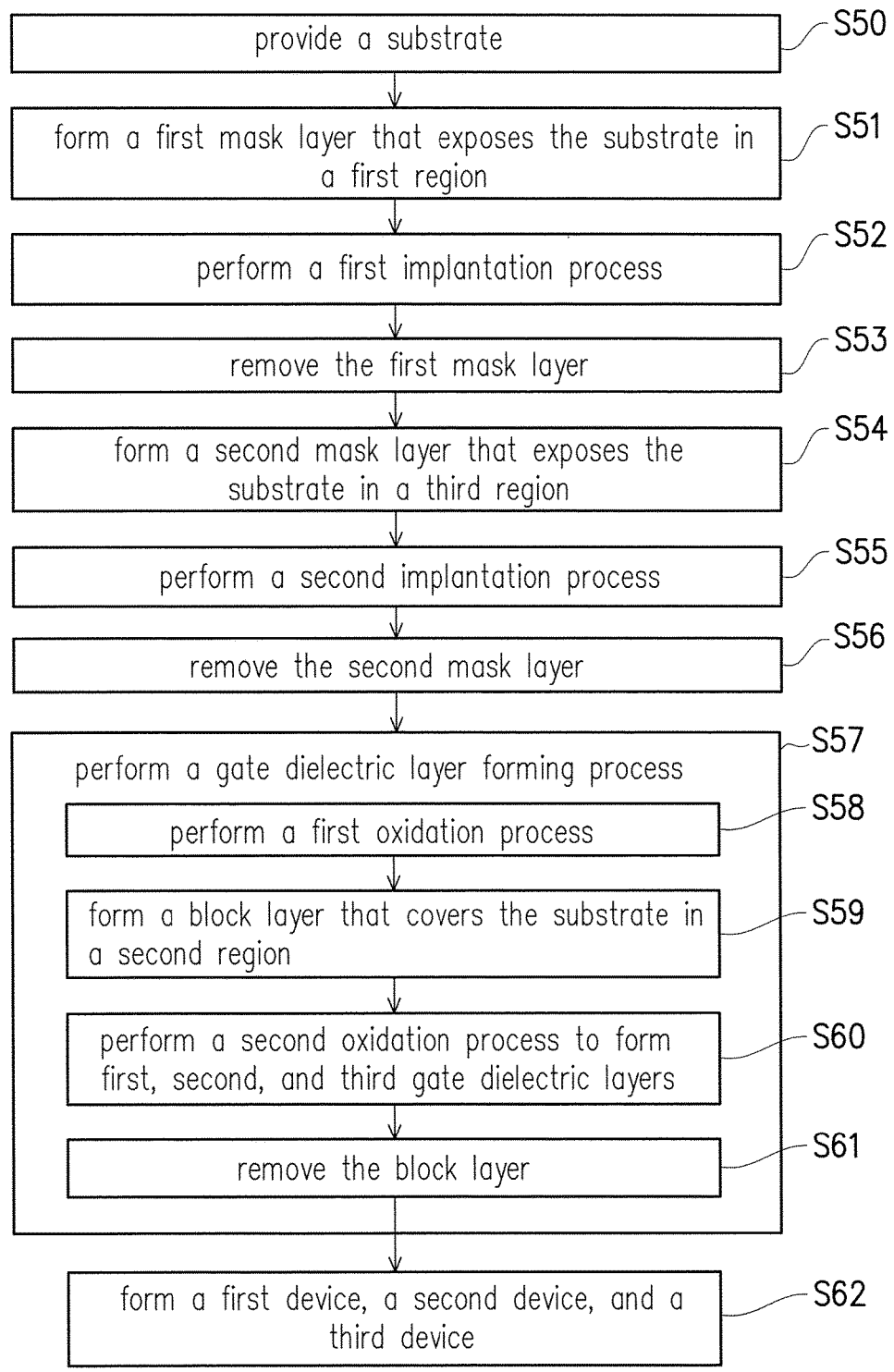
FIG. 6 is a flowchart illustrating a manufacturing method of the semiconductor device according to the third embodiment of the disclosure.

Referring to FIG. 5A and FIG. 6, in step S50, a substrate 100 is provided. The substrate 100 may include a doped region 101 and isolation structures (not shown) formed therein. The substrate 100 may include a first region R1, a second region R2, and a third region R3. In some alternative embodiments, the first region R1 and the third region R3 may be periphery regions, for example, I/O regions, and the second region R2 may be a core region. For example, a first device D1, a second device D2, and a third device D3 (shown in FIG. 5F) are to be formed in the first region R1, the second region R2, and the third region R3 respectively. The first device D1, the second device D2, and the third device D3 may be a first MOS device, a second MOS device, and a third MOS device respectively. Further, a threshold voltage of the first MOS device in the first region R1 is greater than a threshold voltage of the third MOS device in the third region R3.

Referring to FIG. 5A and FIG. 6, in step S51, a first mask layer 160 having a first opening 162 is formed on the substrate 100. The first mask layer 160 covers the second region R2 and the third region R3, and the first opening 162 of the first mask layer 160 exposes the first region R1. In some embodiments, the first mask layer 160 is a patterned photoresist layer.

Referring to FIG. 5A and FIG. 6, in step S52, a first implantation process 60 is performed on a surface of the substrate 100 by using the first mask layer 160 as a mask. The first implantation process 60 may be an ion implantation process, so that an implantation species is implanted into the doped region 101 in the first region R1. As a result, a growth promoting region 164 is formed in the doped region 101 in the first region R1. The implantation species of the first implantation process 60 may include growth promoting species, such as fluorine (F). The first implantation process 60 may be performed at a range of energy values and dosages. In some embodiments, the energy values may range from 5 keV to 15 keV, and the dosage may range from $1\times10^{14}/cm^2$ to $1\times10^{16}/cm^2$.

Figure 5B:
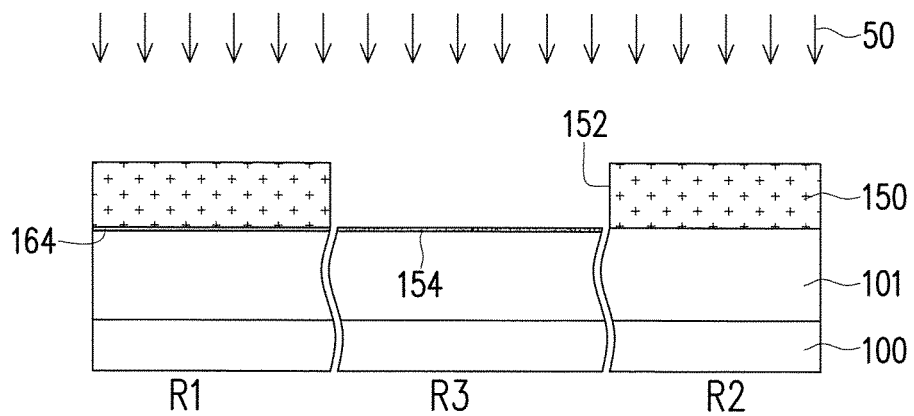

Referring to FIG. 5A and FIG. 5B and FIG. 6, in step S53, the first mask layer 160 is removed to expose surfaces of the doped region 101 in the first region R1, the second region R2, and the third region R3. The first mask layer 160 may be removed by an ashing process, a wet clean process, or a combination thereof.

Referring to FIG. 5B and FIG. 6, in step S54, a second mask layer 150 having a second opening 152 is formed on the substrate 100. The second mask layer 150 covers the first region R1 and the second region R2, and the second opening 152 of the mask layer 150 exposes the third region R3. In some embodiments, the second mask layer 150 is a patterned photoresist layer.

Referring to FIG. 5B and FIG. 6, in step S55, a second implantation process 50 is performed on a surface of the substrate 100 by using the second mask layer 150 as a mask. The second implantation process 50 may be an ion implantation process, so that an implantation species is implanted into the doped region 101 in the third region R3. In some embodiments, the second implantation process 50 and the first implantation process 60 use different implantation species. In the first implantation process 60, the growth promoting region 164 is formed. In the second implantation process 50, a growth slowing region 154 is formed in the doped region 101 in the third region R3. The implantation species of the second implantation process 50 may include a growth slowing species, such as an n-type dopant. The n-type dopant includes phosphorus or arsenic. The second implantation process 50 may be performed at a range of energy values and dosages. In some embodiments, the energy values may range from 5 keV to 15 keV, and the dosage may range from $1 \times 10^{14}$/cm$^2$ to $1 \times 10^{16}$/cm$^2$.

Figure 5C:
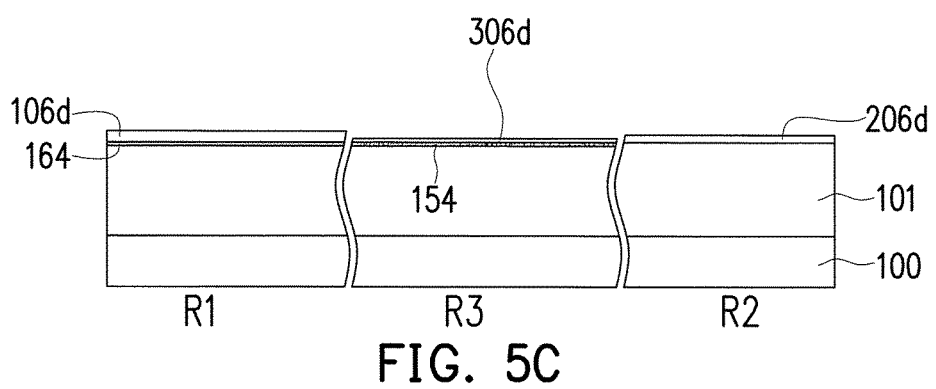

Referring to FIG. 5C and FIG. 6, in step S56, the second mask layer 150 is removed by an ashing process, a wet clean process, or a combination thereof, for example.

In the above embodiments, the growth promoting region 164 in the first region R1 is formed first, and then the growth slowing region 154 in the third region R3 is formed. However, the disclosure is not limited thereto. In another embodiment, the growth slowing region 154 in the third region R3 may be formed first, and then the growth promoting region 164 in the first region R1 is formed.

Figure 5D:
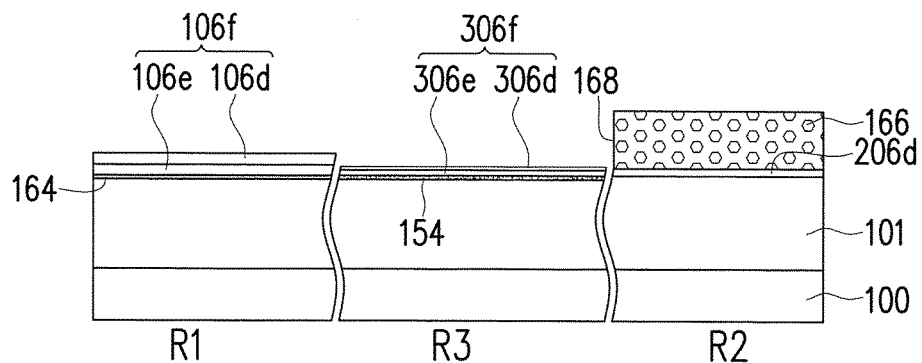

Referring to FIG. 5C and FIG. 5D, in step S57, a gate dielectric layer forming process is performed on form a first dielectric layer 106f, a second dielectric layer 206d, and a third dielectric layer 306f on the doped region 101 in the first region R1, the second region R2, and the third region R3 respectively. In some embodiments, the gate dielectric layer forming process may include the following processes.

Referring to FIG. 5C and FIG. 6, in step S58, a first oxidation process is performed, so as to form a first dielectric layer 106d, a second dielectric layer 206d, and a third dielectric layer 306d on the doped region 101 in the first region R1, the second region R2, and the third region R3. Because the growth slowing region 154 is formed in the third region R3, the third dielectric layer 306d is thinner than the second dielectric layer 206d. Further, because the growth promoting region 164 is formed in the first region R1, the first dielectric layer 106d is thicker than the second dielectric layer 206d. In some embodiments, the first oxidation process is a thermal oxidation process, a high temperature oxidation process, or a combination thereof. The first oxidation process may be performed at a temperature range from 800° C. to 1200° C.

Referring to FIG. 5C, FIG. 5D; and FIG. 6, in step S59, a block layer 166 having an opening 168 is formed on the substrate 100. The block layer 166 covers the second region R2, and the opening 168 of the block layer 136 exposes the first region R1 and the third region R3. The block layer 166 may be a single layer or multiple layers. In some embodiments, the block layer 166 is formed by a dielectric material layer. The dielectric material layer may be silicon nitride formed by performing a suitable process such as an ALD process, a CVD process, a PVD process, a plating process, or a combination thereof, for example. Thereafter, the dielectric material layer is patterned by performing a photolithographic process and an etching process.

Referring to FIG. 5D and FIG. 6, in step S60, a second oxidation process is performed by using the block layer 166 as a mask, so as to form a first dielectric layer 106e and a third dielectric layer 306e on the doped region 101 in the first region R1 and the third region R3 respectively. The second region R2 is covered by the block layer 166, therefore the thickness of the second dielectric layer 206d is not increased significantly. In some embodiments, the second oxidation process is a thermal oxidation process, a high temperature oxidation process, or a combination thereof. The first oxidation process may be performed at a temperature range from 800° C. to 1200° C.

As a result, the first dielectric layer 106f, the second dielectric layer 206d, and the third dielectric layer 306f are formed on the doped region 101 in the first region R1, the second region R2, and the third region R3 respectively. The first dielectric layer 106f includes the first dielectric layer (first part) 106d and the first dielectric layer (second part) 106e, and the third dielectric layer 306f includes the third dielectric layer (first part) 306d and the third dielectric layer (second part) 306e. The first dielectric layer 106f is thicker than the third dielectric layer 306f, and the third dielectric layer 306f is thicker than the second dielectric layer 206d. In some embodiments, the thickness of the first dielectric layer 106f is about 55 angstroms to about 60 angstroms, the thickness of the third dielectric layer 306f is about 41 angstroms to about 51 angstroms, and the thickness of the second dielectric layer 206d is about 15 angstroms to about 25 angstroms.

Figure 5E:
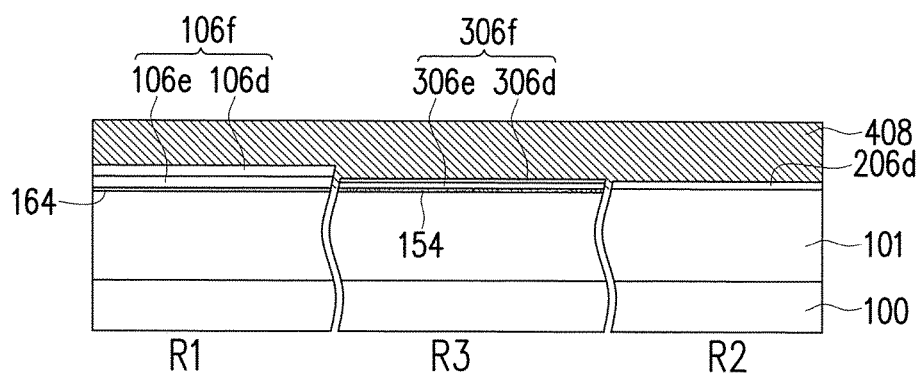

Referring to FIG. 5E, FIG. 5F, and FIG. 6, in step S61 and step S62, the block layer 136 is removed by an etch process such as an isotropic etch process. A first device D1, a second device D2, and a third device D3 are formed on the substrate 100 in the first region R1, the second region R2, and the third region R3 respectively. The first device D1, the second device D2, and the third device D3 include a first gate dielectric layer 106, a second gate dielectric layer 206, and a third gate dielectric layer 306. The first, second, and third gate dielectric layers 106, 206, and 306 are formed from the first dielectric layer 106f, the second dielectric layer 206d, and the third dielectric layer 306f. In some embodiments, the first device D1, the second device D2, and the third device D3 are a first MOS device, a second MOS device, and a third MOS device respectively. The method of forming the first MOS device, the second MOS device, and the third MOS device of the third embodiment are similar to the first MOS device, the second MOS device, and the third MOS device of the second embodiment.

Via the selective implantation of fluorine into the substrate in the first region and the selective implantation of the n-type dopant into the third region, the difference in the thicknesses of the first gate dielectric layer and the third gate dielectric layer can be more significant. As a result, a device having high gain can be obtained.

Figure 7A:
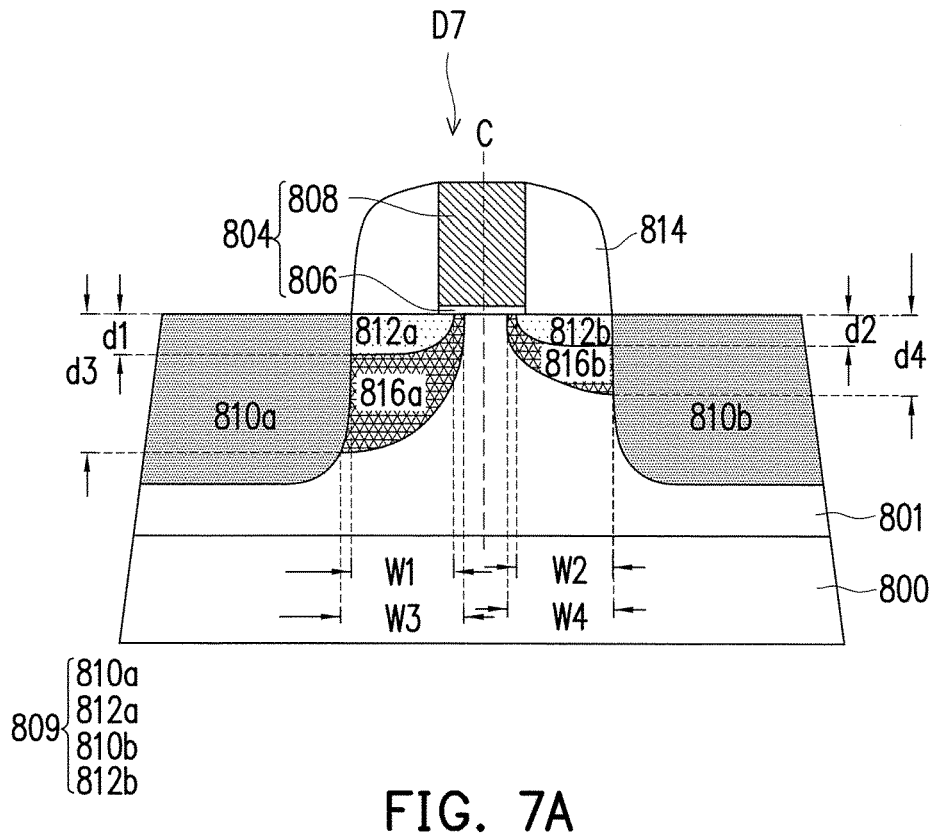
FIG. 7A and FIG. 7C are schematic cross-sectional views illustrating semiconductor devices according to a fourth embodiment of the disclosure.
Figure 7B:
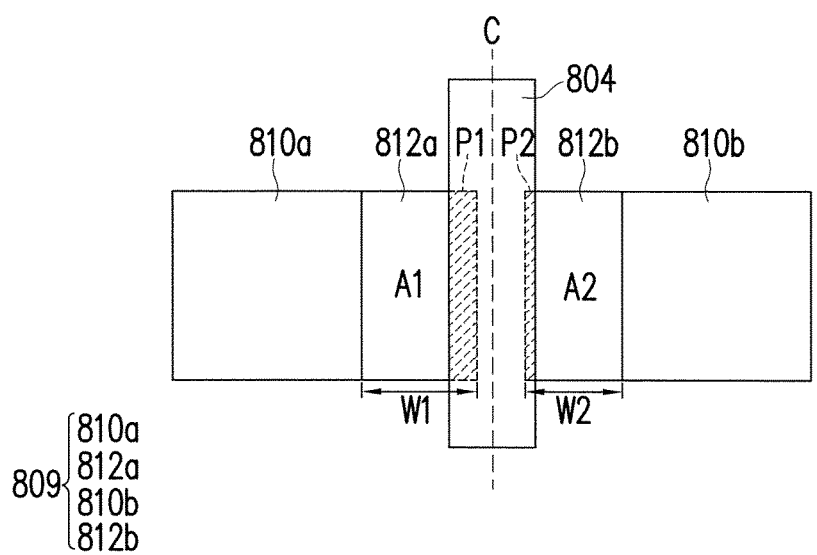
FIG. 7B is a schematic top view illustrating the semiconductor device of FIG. 7A.
Figure 7C:
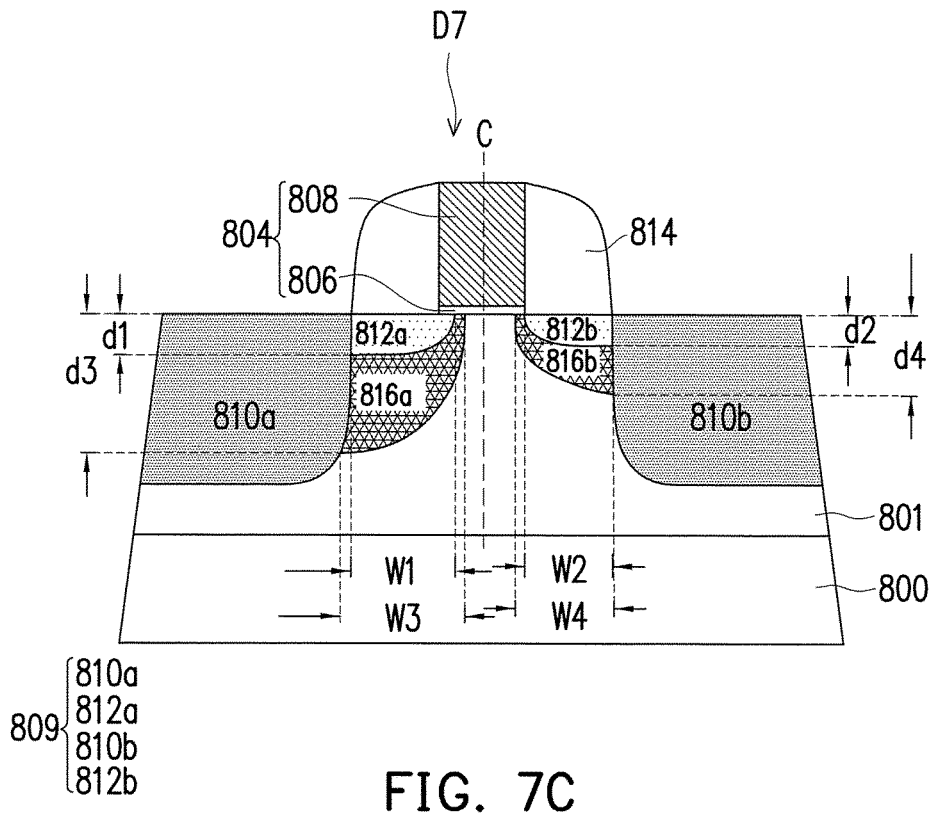
Figure 7D:
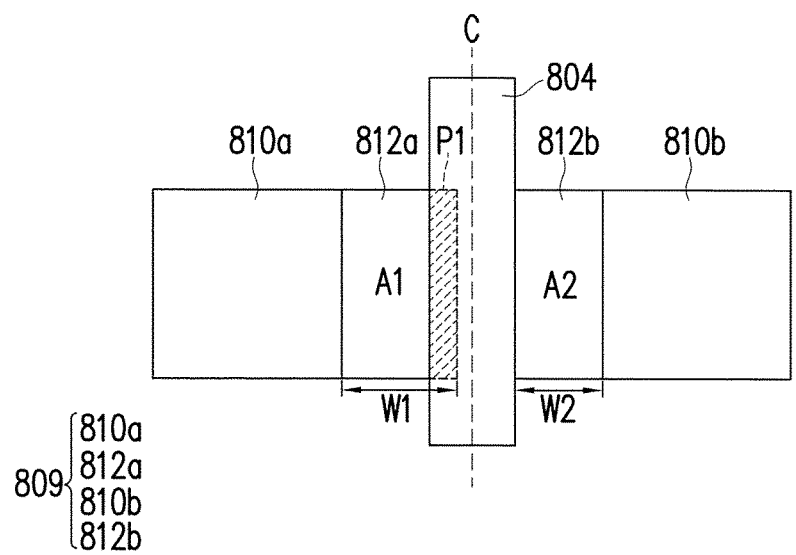
FIG. 7D is a schematic top view illustrating the semiconductor device of FIG. 7C.

FIG. 7A and FIG. 7C are schematic cross-sectional views illustrating semiconductor devices according to a fourth embodiment of the disclosure. FIG. 7B is a schematic top view illustrating the semiconductor device of FIG. 7A. FIG. 7D is a schematic top view illustrating the semiconductor device of FIG. 7C.

Referring to FIG. 7A and FIG. 7C, a substrate 800 is provided. The material of substrate 800 may be similar to that of the substrate 100. The substrate 800 may include various doped regions depending on design requirements (e.g., p-type substrate or n-type substrate). In some embodiments, a doped region 801, formed in the substrate 800, may be a well, a buried doped region, or a combination thereof. In some embodiments, the doped region 801 and the substrate 800 have the same conductivity type. In some alternative embodiments, the doped region 801 and the substrate 800 have different conductivity types. In some embodiments, the doped region 801 may be doped with p-type or n-type dopants. For example, the doped region 801 may be doped with p-type dopants, such as boron, $BF_2^+$, and/or a combination thereof; and n-type dopants, such as phosphorus, arsenic, and/or a combination thereof.

Referring to FIG. 7A and FIG. 7C, a semiconductor device D7 is formed on the substrate 800. The semiconductor device D7 may be a MOS device. The semiconductor device D7 may include a gate stack 804 and a plurality of doped regions 809. The gate stack 804 includes a gate dielectric layer 806 and a gate electrode 808 on the gate dielectric layer 806. In some embodiments, the gate stack 804 of the fourth embodiment may be similar to the first gate stack 104, the second gate stack 204, or the third gate stack 304 of the first embodiment. That is, the gate dielectric layer 806 is similar to the first gate dielectric layer 106, the second gate dielectric layer 206, or the third gate dielectric layer 306. Similarly, the gate electrode 808 is similar to the first gate electrode 108, the second dielectric layer 208, or the third gate dielectric layer 308.

Referring to FIG. 7A and FIG. 7C, the plurality of doped regions 809 have a same conductivity type dopant therein. In some embodiment, the device D7 is a PMOS device, the plurality of doped regions 809 have p-type dopants, such as boron, $BF_2^+$, and/or a combination thereof. In some alternative embodiments, the device D7 is a NMOS device, and the plurality of doped regions 809 have n-type dopants, such as phosphorus, arsenic, and/or a combination thereof.

Referring to FIG. 7A and FIG. 7C, the plurality of doped regions 809 are formed in the substrate 800. The plurality of doped regions 809 include a first doped region 810a, a second doped region 810b, a first lightly doped region 812a, and a second lightly doped region 812b. The first doped region 810a is formed in the substrate 800 at a first side of the gate stack 804. The second doped region 810b is formed in the substrate 800 at a second side of the gate stack 804. In some embodiments, the first doped region 810a and the second doped region 810b have similar properties. For example, the properties include at least one of a concentration, a depth, a profile, a cross-section area or a combination thereof.

Referring to FIG. 7A and FIG. 7C, the first lightly doped region 812a is formed in the substrate 800 at the first side of the gate stack 804. The second doped lightly doped region 812b is formed in the substrate 800 at the second side of the gate stack 804. In other words, the first lightly doped region 812a is formed in the substrate 800 between the gate stack 804 and the first doped region 810a. The second lightly doped region 812b is formed in the substrate 800 between the gate stack 804 and the second doped region 810b. A property of the first lightly doped region 812a is different from a property of the second lightly doped region 812b. For example, the property includes at least one of a concentration, a depth, a profile, a cross-section area or combination thereof.

Referring to FIG. 7A and FIG. 7C, in some embodiments, the first lightly doped region 812a is a lightly doped source region and the second lightly doped region 812a is a lightly doped drain region, and a concentration of the first lightly doped region 812a is greater than a concentration of the second lightly doped region 812b.

Referring to FIG. 7A and FIG. 7C, in some alternative embodiments, the first lightly doped region 812a is a lightly doped source region and the second lightly doped region 812a is a lightly doped drain region, and a depth d1 of the first lightly doped region 812a is greater than a depth d2 of the second lightly doped region 812b.

Referring to FIG. 7A and FIG. 7C, in yet some other alternative embodiments, a profile of the first lightly doped region 812a is different from a profile of the second lightly doped region 812b.

Referring to FIG. 7A to FIG. 7D, in yet some other alternative embodiments, the first lightly doped region 812a is a lightly doped source region and the second lightly doped region 812a is a lightly doped drain region, and a cross-section area A1 of the first lightly doped region 812a is greater than a cross-section area A2 of the second lightly doped region 812b.

Referring to FIG. 7A to FIG. 7D, in yet some other alternative embodiments, the first lightly doped region 812a is a lightly doped source region and the second lightly doped region 812a is a lightly doped drain region, and a width W1 of the first lightly doped region 812a is greater than a width W2 of the second lightly doped region 812b.

Referring to FIG. 7A and FIG. 7B, a first portion P1 of the first lightly doped region 812a and a second portion P2 of the second lightly doped region 812b may covered by the gate stack 804. In some embodiments, the first lightly doped region 812a is a lightly doped source region and the second lightly doped region 812a is a lightly doped drain region, and the first portion P1 is larger than the second portion P2.

Referring to FIG. 7C and FIG. 7D, in some alternative embodiments, the first lightly doped region 812a is covered by the gate stack 804, but the second lightly doped region 812b is not covered by the gate stack 804. In other words, the first lightly doped region 812a has a portion P1 that is covered by the gate stack 804, and the second lightly doped region 812b has no area covered by the gate stack 804.

Referring to FIG. 7A and FIG. 7C, in some embodiments, the semiconductor device D7 may further include a first pocket region 816a and a second pocket region 816b. The conductivity type of the first pocket region 816a and the second pocket region 816b are different form the conductivity type of the plurality of doped regions 809. In some embodiments, the plurality of doped regions 809 have first conductivity type dopants, and the first pocket region 816a and the second pocket region 816b have second conductivity type dopants. The second conductivity type is opposite to the first conductivity type. In other words, the device D7 is a PMOS device, the first pocket region 816a and the second pocket region 816b have n-type dopants, such as phosphorus, arsenic, and/or a combination thereof. In some alternative embodiments, the device D7 is an NMOS device, and the first pocket region 816a and the second pocket region 816b have p-type dopants, such as boron, $BF_2^+$, and/or a combination thereof. A property of the first pocket region 816a is different from a property of the second pocket region 816b. For example, the property includes at least one of a concentration, a depth, a profile, a cross-section area or a combination thereof.

In some embodiments, the first lightly doped region 812a is a lightly doped source region and the second lightly doped region 812a is a lightly doped drain region, and a concentration of the first pocket region 816a is greater than a concentration of the second pocket region 816b.

In some alternative embodiments, the first lightly doped region 812a is a lightly doped source region and the second lightly doped region 812a is a lightly doped drain region, and a depth d3, a width W3, or cross-section area of the first pocket region 816a is greater than a depth d4, a width W4, or cross-section area of the second pocket region 816b.

In other words, the first lightly doped region 812a and the second lightly doped region 812b are asymmetric, and the first pocket region 816a and the second pocket region 816b are also asymmetric.

Referring to FIG. 7A to FIG. 7D, in some embodiments, the semiconductor device D7 may further include spacers 814 formed at sidewalls of the gate stack 804. The spacers 814 may be similar to the first spacers 114, the second spacers 214, or the third spacers 314.

Figure 8:
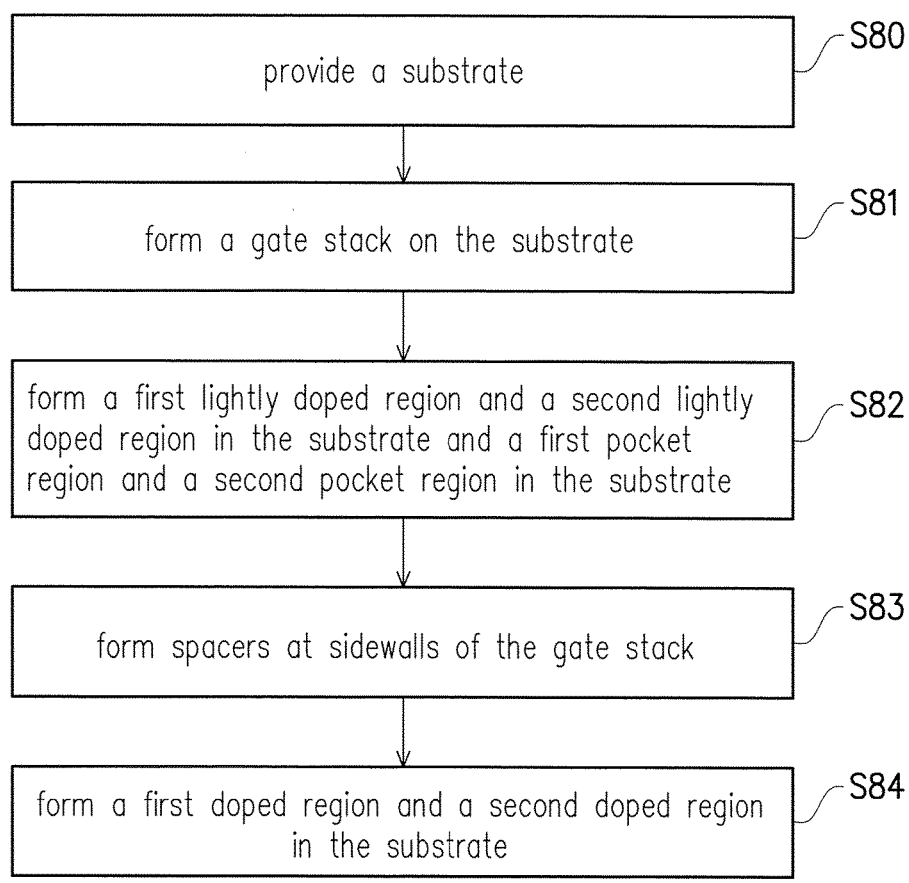
FIG. 8 is a flowchart illustrating a manufacturing method of the semiconductor device according to the fourth embodiment of the disclosure.

FIG. 8 is a flowchart illustrating a manufacturing method of the semiconductor devices according to the fourth embodiment of the disclosure.

Referring to FIG. 7A, FIG. 7C and FIG. 8, in step S80, the substrate 800 is provided. In step S81, the gate stack 804 is formed on the substrate 800. The method of forming the gate stack 804 includes the following processes. First, a gate dielectric material layer is formed on the substrate 800 and a gate material layer on the gate dielectric material layer. The gate dielectric material layer and the gate material layer are patterned by performing a photolithographic process and an etching process, for example.

Referring to FIG. 7A, FIG. 7C, and FIG. 8, in step S82, a first lightly doped region 812a and a second lightly doped region 812b are formed by different processes. In addition, a first pocket region 816a and a second pocket region 816b are formed by different processes.

The first lightly doped region 812a and the first pocket region 816a may be formed by the following processes. A first mask layer is formed to cover the substrate 800 at the second side of the gate stack 804. Then, a first implantation process such as an ion implantation process is performed on the substrate 800 with the first mask layer as a mask so as to form the first lightly doped region 812a in the substrate 800 at the first side of the gate stack 804. Thereafter, a first pocket implantation process such as an ion implantation process is performed on the substrate 800 with the first mask layer as a mask so as to form the first pocket region 816a adjacent to the first lightly doped region 812a.

Similarly, the second lightly doped region 812b and the second pocket region 816a may be formed by the following processes. A second mask layer is formed to cover the substrate 800 at the first side of the gate stack 804. Then, a second implantation process such as an ion implantation process is performed on the substrate 800 with the second mask layer as a mask, so as to form the second lightly doped region 812b in the substrate 800 at the second side of the gate stack 804. Thereafter, a second pocket implantation process such as an ion implantation process is performed on the substrate 800 with the second mask layer as a mask so as to form the second pocket region 816b adjacent to the second lightly doped region 812b.

The first implantation process and the second implantation process are performed at different ranges of energy values and/or dosages. In some embodiments, first energy values and/or a first dosage of the first implantation process is greater than second energy values and/or a second dosage of the second implantation process. For example, the first energy values may range from 6 keV to 12 keV, and the second energy values may range from 4 keV to 8 keV; and the first dosage may range from $5\times10^{13}/cm^2$ to $5\times10^{14}/cm^2$, and the second dosage may range from $5\times10^{12}/cm^2$ to $5\times10^{13}/cm^2$. For example, a ratio of the first energy values of the first implantation process to the second energy values of the second implantation process is about 1.5 to 2.5, and a ratio of the first dosage of the first implantation process to the second dosage of the second implantation process is about 5 to 15.

Similarly, the first pocket implantation process and the second pocket implantation process are performed at different ranges of energy values and/or dosages. In some embodiments, first energy values and/or a first dosage of the first pocket implantation process is greater than second energy values and/or a second dosage of the second pocket implantation process. For example, a ratio of the first energy values of the first pocket implantation process to the second energy values of the second pocket implantation process is about 1.5 to 2.5, and a ratio of the first dosage of the first pocket implantation process to the second dosage the second pocket implantation process is about 5 to 15.

Referring to FIG. 7A, FIG. 7C, and FIG. 8, in step S83, the spacers 814 are formed at the sidewalls of the gate stack 804. In step S84, a first doped region 810a and a second doped region 810b are formed. In some embodiments, the first doped region 810a and the second doped region 810b may be formed by a same third implantation process such as an ion implantation process, so that the first doped region 810a and the second doped region 810b are formed at the same time. In some embodiments, third energy values and/or a third dosage of the same third implantation process are/is greater than the first and second energy values and/or the first and the second dosages of the first and the second implantation processes.

By varying the properties of the LDDs, Gm/Id of the device can be enhanced. As a result, a device having high gain can be obtained.

Figure 9A:
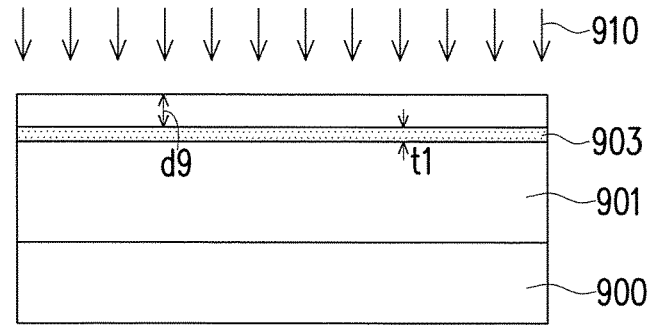
FIG. 9A to FIG. 9C are schematic cross-sectional views illustrating a semiconductor device according to a fifth embodiment of the disclosure.
Figure 9B:
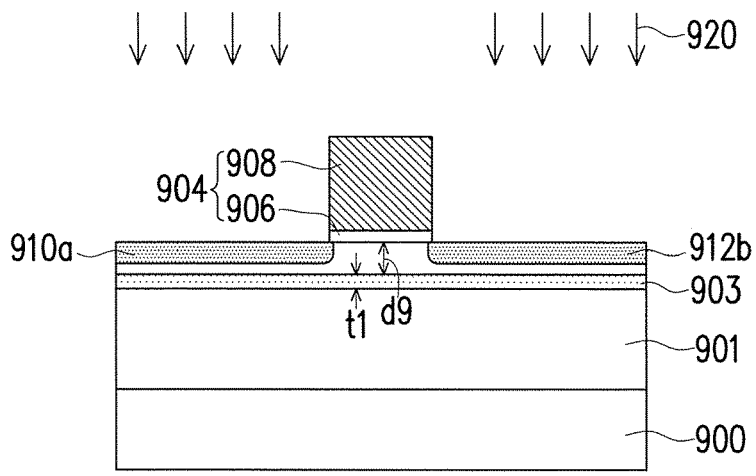
Figure 9C:
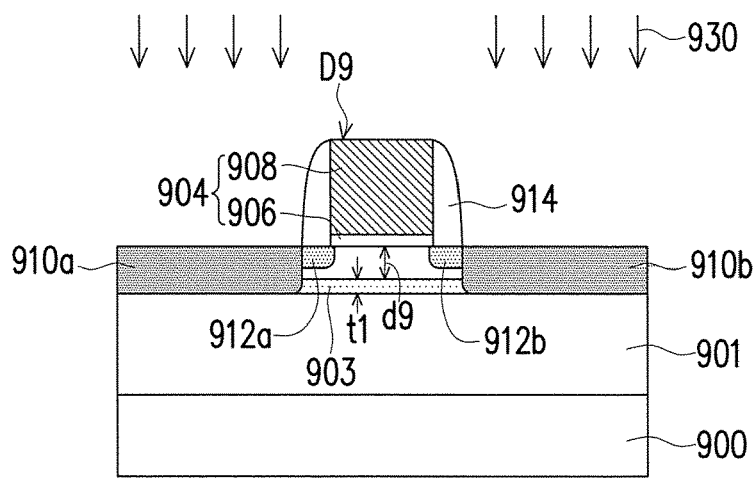
Figure 10:
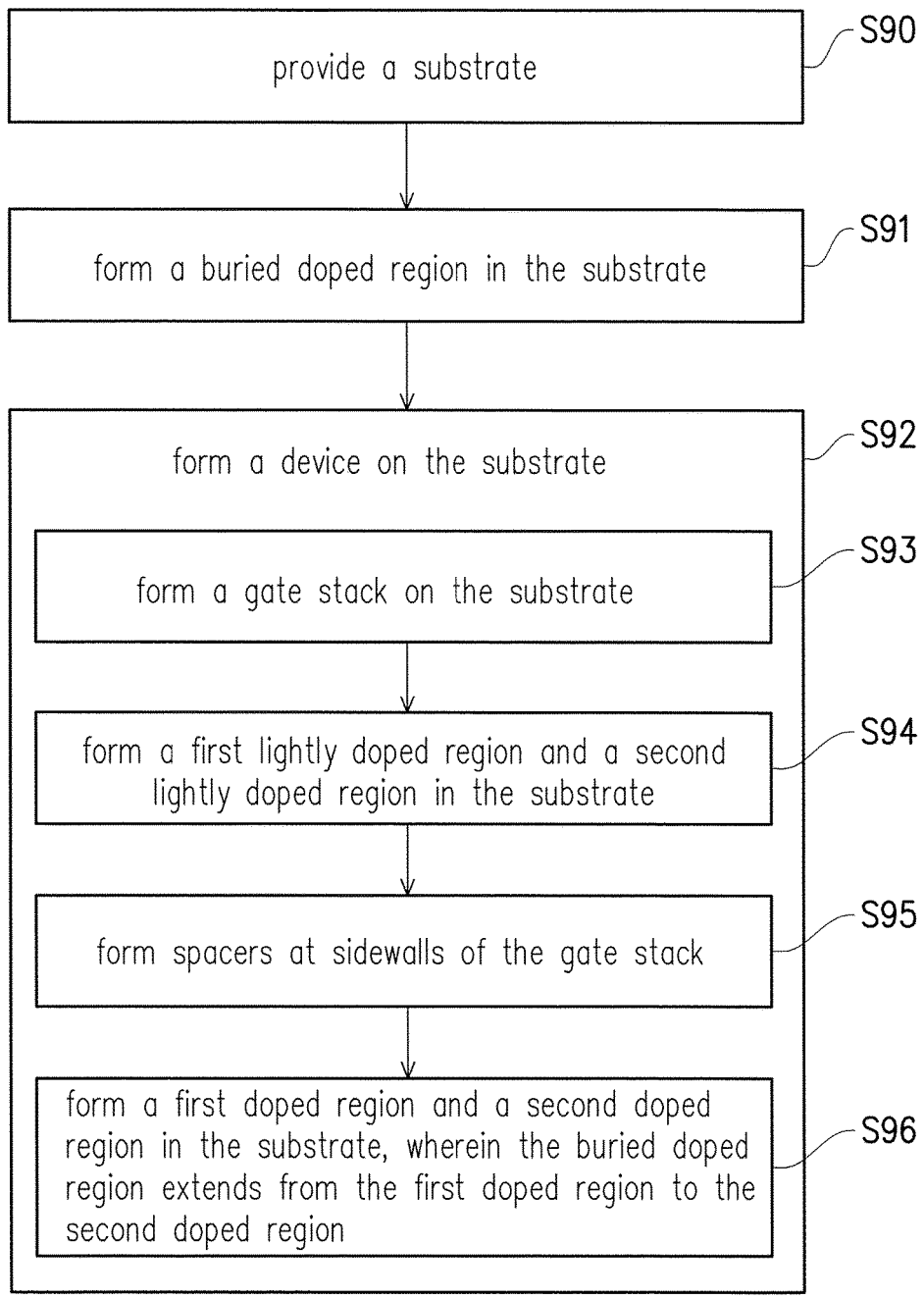
FIG. 10 is a flowchart illustrating a manufacturing method of the semiconductor device according to the fifth embodiment of the disclosure.

FIG. 9A to FIG. 9C are schematic cross-sectional views illustrating a semiconductor device according to a fifth embodiment of the disclosure. FIG. 10 is a flowchart illustrating a manufacturing method of the semiconductor device according to the fifth embodiment of the disclosure.

Referring to FIG. 9A and FIG. 10, in step S90, a substrate 900 is provided. The material of substrate 900 may be similar to that of the substrate 100. The substrate 900 may include various doped regions depending on design requirements (e.g., p-type substrate or n-type substrate). In some embodiments, a doped region 901, formed in the substrate 900, may be a well. In some embodiments, the doped region 901 and the substrate 900 have the same conductivity type. In some alternative embodiments, the doped region 901 and the substrate 900 have different conductivity types. In some embodiments, the doped region 901 may be doped with p-type or n-type dopants. For example, the doped region 901 may be doped with p-type dopants, such as boron, $BF_2^+$, and/or a combination thereof; and n-type dopants, such as phosphorus, arsenic, and/or a combination thereof.

Referring to FIG. 9A and FIG. 10, in step S91, a buried doped region 903 is formed in the doped region 901. The buried doped region 903 may be doped with p-type or n-type dopants. In some embodiments, the buried doped region 903 include p-type dopants for an PMOS device, such as boron, $BF_2^+$, and/or a combination thereof. In some alternative embodiments, the buried doped region 903 includes n-type dopants for an NMOS device, such as phosphorus, arsenic, and/or a combination thereof. The buried doped region 903 may be formed by performing a first implantation process 910. The first implantation process 910 may be a counter-doping process performed at a range of first energy values and first dosages. In some embodiments, the first energy values may range from 10 keV to 50 keV, and the first dosage may range from $1\times10^{13}/cm^2$ to $1\times10^{15}/cm^2$. The buried doped region 903 is separated from the gate stack 904 by a distance d9. The distance d9 is about 50 nm to 60 nm, for example. A thickness t1 of the buried doped region 903 ranges from 5 nm to 10 nm, for example.

Referring to FIG. 9C and FIG. 10, in step S92, a device D9 is formed on the substrate 900. In some embodiments, the device D9 is a MOS device. The method of forming the MOS device of the fifth embodiment is similar to the first MOS device, the second MOS device, or the third MOS device of the second embodiment. The device D9 may be formed by the following process.

Referring to FIG. 9B and FIG. 10, in step S93, a gate stack 904 is formed on the substrate 900. The gate stack 904 includes a gate dielectric layer 906 and a gate electrode 908. In some embodiments, the gate electrode 908 may be doped with p-type or n-type dopants. In some embodiments, the gate electrode 908 includes p-type dopants for an NMOS device, such as boron, $BF_2^+$, and/or a combination thereof. In some alternative embodiments, the gate electrode 908 includes n-type dopants for a PMOS device, such as phosphorus, arsenic, and/or a combination thereof.

The method of forming the gate stack 904 includes the following process. First, a gate dielectric material layer is formed on the doped region 901 and a gate material layer on the gate dielectric material layer. The gate dielectric material layer and the gate material layer are patterned by performing a photolithographic process and an etching process so as to form the gate dielectric layer 906 and the gate electrode 908.

Referring to FIG. 9B and FIG. 10, in step S94, a first lightly doped region 912a and a second lightly doped region 912b are formed in the doped region 901 at a first side and a second side of the gate stack 904 respectively. The first lightly doped region 912a and the second lightly doped region 912b may be doped with p-type or n-type dopants. In some embodiments, the first lightly doped region 912a and the second lightly doped region 912b include p-type dopants for a PMOS device, such as boron, $BF_2^+$, and/or a combination thereof. In some alternative embodiments, the first lightly doped region 912a and the second lightly doped region 912b include n-type dopants for an NMOS device, such as phosphorus, arsenic, and/or a combination thereof. The first lightly doped region 912a and the second lightly doped region 912b may be formed by performing a second implantation process 920 such as an ion implantation. In some embodiment, second energy values of the second implantation process 920 may range from 5 keV to 10 keV, and second dosage of the second implantation process 920 may range from $5 \times 10^{12}/cm^2$ to $5 \times 10^{13}/cm^2$. The first lightly doped region 912a and the second lightly doped region 912b are formed above the buried doped region 903.

Referring to FIG. 9C and FIG. 10, in step S95, the spacers 914 are formed at the sidewalls of the gate stack 904 in the doped region 901 beside the spacers 914. In step S96, the first doped region 910a and the second doped region 910b are formed. In some embodiments, the first doped region 910a and the second doped region 910b include p-type dopants for a PMOS device, such as boron, $BF_2^+$, and/or a combination thereof. In some alternative embodiments, the first doped region 910a and the second doped region 910b include n-type dopants for an NMOS device, such as phosphorus, arsenic, and/or a combination thereof. In some embodiments, the first doped region 910a and the second doped region 910b may be formed by a third implantation process 930 such as an ion implantation process, so that the first doped region 910a and the second doped region 910b are formed. In some embodiments, third energy values and/or a third dosage of the third implantation process 930 are/is greater than the second energy values and/or the second dosages of the second implantation process 920. The third energy values of the third implantation process 930 is greater than or the same as the first energy values of the first implantation process 910. The third dosage of the third implantation process 930 is less than the first dosage of the first implantation process 910.

The buried doped region 903 is located in the doped region 901 under the gate stack 904, the first lightly doped region 912a and the second lightly doped region 912b.

The buried doped region 903, the first lightly doped region 912a, the second lightly doped region 912b, the first doped region 910a, and the second doped region 910b have the same conductivity dopants. In some embodiments, the buried doped region 903, the first lightly doped region 912a, the second lightly doped region 912b, the first doped region 910a, and the second doped region 910b are of a first conductivity type, the doped region 901 or the substrate 900 is of a second conductivity type, and the gate electrode 908 is of the second conductivity type. The second conductivity type is opposite to the first conductivity type.

The doping concentration of the buried doped region 903 is less than the doping concentration of the first doped region 910a and the second doped region 910b. Further, the buried doped region 903 extends from the first doped region 910a to the second doped region 910b. In some embodiments, the buried doped region 903 is in physical contact with the first doped region 910a and the second doped region 910b to serve as a buried channel under a surface channel which is between the first doped region 910a and the second doped region 910b and under the gate stack 904.

Because the buried channel is away from an interface between the substrate and the gate dielectric layer, current can be away from the gate dielectric layer, and therefore damage to the gate dielectric layer 906 may be reduced. As a result, device noise can be reduced.

The present disclosure is not limited to applications in which the semiconductor device includes MOSFETs, and may be extended to FinFETs.

In accordance with some embodiments of the present disclosure, a manufacturing method the semiconductor device is as below. A substrate is provided, wherein the substrate includes a first region, a second region, and a third region. A first implantation process is performed, so as to implant a first implantation species into the substrate at least in the first region, and wherein the first implantation species includes fluorine. A gate dielectric layer forming process is performed, so as to form a first gate dielectric layer on the substrate in the first region, a second gate dielectric layer in the second region, and a third gate dielectric layer on the substrate in the third region, wherein a thickness of the first gate dielectric layer is greater than a thickness of the third gate dielectric layer, and the thickness of the third gate dielectric layer is greater than a thickness of the second gate dielectric layer.

In accordance with alternative embodiments of the present disclosure, a semiconductor device includes a gate stack, a first doped region, a second doped region, a first lightly doped region and a second lightly doped region. The gate stack is disposed on a substrate. The first doped region is located in the substrate at a first side of the gate stack. The second doped region is located in the substrate at a second side of the gate stack. The first lightly doped region is located in the substrate between the gate stack and the first doped region. The second lightly doped region is located in the substrate between the gate stack and the second doped region. A property of the first lightly doped region is different from a property of the second lightly doped region.

In accordance with yet some other alternative embodiments of the present disclosure, a semiconductor device includes a gate stack, and a first doped region, a second doping region, and a buried doped region of a first conductivity type. The gate stack is disposed on a substrate. The first doped region is located in the substrate at a first side of the gate stack. The second doping region is located in the substrate at a second side of the gate stack. The buried doped region is buried in the substrate, from the first doped region to the second doped region, and separated from the gate stack by a distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor device, comprising:
   providing a substrate, the substrate comprising a first region, a second region, and a third region;
   performing a first implantation process, so as to implant a first implantation species into the substrate in the first region, and wherein the first implantation species comprises fluorine, wherein the second region and the third region are blocked when performing the first implantation process; and
   performing a gate dielectric layer forming process, so as to form a first gate dielectric layer on the substrate in the first region, a second gate dielectric layer on the substrate in the second region, and a third gate dielectric layer on the substrate in the third region,
   wherein a thickness of the first gate dielectric layer is greater than a thickness of the third gate dielectric layer, and the thickness of the third gate dielectric layer is greater than a thickness of the second gate dielectric layer.

2. The manufacturing method of the semiconductor device according to claim 1, wherein the first implantation process is performed to form a growth promoting region in a surface of the substrate in the first region.

3. The manufacturing method of the semiconductor device according to claim 2, further comprising:
   forming a first mask layer that covers the second region and the third region and exposes the first region before performing the first implantation process;
   performing the first implantation process with the first mask layer as a mask;
   removing the first mask layer; and
   performing the gate dielectric layer forming process comprising:
      performing a first oxidation process to form a first part of the first gate dielectric layer, the second gate dielectric layer, and a first portion of the third gate dielectric layer;
      forming a block layer that covers the second gate dielectric layer in the second region and exposes the first region and the third region; and
      performing a second oxidation process to form a second part of the first gate dielectric layer and a second portion of the third gate dielectric layer.

4. The manufacturing method of the semiconductor device according to claim 2, further comprising:
   performing a second implantation process to form a growth slowing region in the surface of the substrate in the third region before performing the gate dielectric layer forming process.

5. The manufacturing method of the semiconductor device according to claim 4, wherein the second species comprises an n-type dopant.

6. The manufacturing method of the semiconductor device according to claim 4, further comprising:
   forming a second mask layer that covers the first region and the second region and exposes the third region;
   performing the second implant process;
   removing the second mask layer; and
   performing the gate dielectric layer forming process comprising:
      performing a first oxidation process to form a first part of the first gate dielectric layer, the second gate dielectric layer, and a first portion of the third gate dielectric layer;
      forming a block layer that covers the second gate dielectric layer in the second region and exposes the first region and the third region; and
      performing a second oxidation process to form a second part of the first gate dielectric layer and a second portion of the third gate dielectric layer.

7. A semiconductor device, comprising:
   a substrate comprising a first region, a second region, and a third region;
   a first gate stack comprising a first gate dielectric layer on the substrate in the first region;
   a second gate stack comprising a second gate dielectric layer on the substrate in the second region; and
   a third gate stack comprising a third gate dielectric layer on the substrate in the third region,
   wherein the substrate in the first region, the second region and the third region comprise an implantation species, and the implantation species comprises fluorine,
   wherein the first gate dielectric layer, the second gate dielectric layer and the third gate dielectric layer have different thicknesses,
   wherein the first gate dielectric layer, the second gate dielectric layer, and the third gate dielectric layer are located on a doped region in the substrate, and the implantation species is comprised in the doped region, the doped region comprises a dopant different from the implantation species,
   wherein the implantation species is further comprised in a junction interface between the doped region and the substrate in the first region, the second region and the third region, and the junction interface is below an isolation structure in the substrate.

8. The semiconductor device according to claim 7, wherein the implantation species is further comprised in sidewalls or a bottom of the isolation structure in the substrate.

9. The semiconductor device according to claim 7, wherein a thickness of the first gate dielectric layer is greater than a thickness of the third gate dielectric layer, and the thickness of the third gate dielectric layer is greater than a thickness of the second gate dielectric layer.

10. A semiconductor device, comprising:
    a substrate comprising a first region, a second region, and a third region;
    a growth promoting region comprising an implantation species in a surface of the substrate in the first region, wherein the implantation species is not comprised in the second region and the third region;
    a first dielectric layer on the growth promoting region of the substrate in the first region;
    a second dielectric layer on the substrate in the second region; and
    a third dielectric layer on the substrate in the third region;
    wherein the first dielectric layer, the second dielectric layer and the third dielectric layer have different thicknesses.

11. The semiconductor device according to claim 10, wherein the implantation species in the growth promoting region comprises a growth promoting species, wherein the growth promoting species comprises fluorine.

12. The semiconductor device according to claim 11, wherein the first dielectric layer is thicker than the third dielectric layer, and the third dielectric layer is thicker than the second dielectric layer.

13. The semiconductor device according to claim 11, wherein the first dielectric layer comprises a first part and a second part, the second part is on the growth promoting region and the first part is on the second part, and the third dielectric layer comprises a first portion and a second portion, the second portion is on the substrate and the first portion is on the second portion.

14. The semiconductor device according to claim 13, wherein the first part of the first dielectric layer is thicker than the second dielectric layer and thicker than the first portion of the third dielectric layer.

15. The semiconductor device according to claim 11, wherein
the first dielectric layer is a first gate dielectric layer of a first device on the substrate in the first region;
the second dielectric layer is a second gate dielectric layer of a second device on the substrate in the second region;
the third dielectric layer is a third gate dielectric layer of a third device on the substrate in the third region; and
a threshold voltage of the first device is higher than a threshold voltage of the third device.

16. The semiconductor device according to claim 10, further comprising a growth slowing region in a surface of the substrate in the third region, wherein the growth slowing region comprises an implantation species different from the implantation species of the growth promoting region.

* * * * *